(12) United States Patent
Oikawa

(10) Patent No.: US 9,006,910 B2
(45) Date of Patent: Apr. 14, 2015

(54) INTERCONNECTION STRUCTURE

(75) Inventor: Ryuichi Oikawa, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 13/015,324

(22) Filed: Jan. 27, 2011

(65) Prior Publication Data

US 2011/0180942 A1 Jul. 28, 2011

(30) Foreign Application Priority Data

Jan. 28, 2010 (JP) .................................. 2010-016444

(51) Int. Cl.
*H01L 23/538* (2006.01)
*H01L 23/495* (2006.01)
(Continued)

(52) U.S. Cl.
CPC .... *H01L 23/49541* (2013.01); *H01L 23/49503* (2013.01); *H01L 23/66* (2013.01); *H01L 2223/6638* (2013.01); *H01L 2224/48247* (2013.01); *H01L 2924/3011* (2013.01); *H01L 24/48* (2013.01); *H01L 2924/01067* (2013.01);
(Continued)

(58) Field of Classification Search
CPC .................. H01L 2924/00; H01L 2224/48091; H01L 2924/30107; H01L 2924/3025; H01L 2924/00014; H01L 2223/6638; H01L 2224/48247; H01L 2224/49171; H01L 2224/73265; H01L 23/49503; H01L 23/49541; H01L 23/66
USPC ............................ 257/670, 676, 692; 438/123
See application file for complete search history.

(56) References Cited

U.S. PATENT DOCUMENTS 5,233,131 A * 8/1993 Liang et al. .................. 174/538
6,576,983 B1 6/2003 Fazelpour et al.
(Continued)

FOREIGN PATENT DOCUMENTS

CN 101562176 A 10/2009

OTHER PUBLICATIONS

Joong-Ho Kim, et al., "Design of Low Cost QFP Packages for Multi-Gigabit Memory Interface", Electronic Components and Technology Conference, 2009, pp. 1662-1669.
(Continued)

*Primary Examiner* — Stephen W Smoot
*Assistant Examiner* — Edward Chin
(74) *Attorney, Agent, or Firm* — Sughrue Mion, PLLC

(57) ABSTRACT

An interconnection structure includes: first and second differential signal interconnections provided to transmit a differential signal; and first and second voltage interconnections applied with predetermined voltages. The first voltage interconnection, the first differential signal interconnection, the second differential signal interconnection and the second voltage interconnection are arranged in this order. An interval between the first and second differential signal interconnections is longer than an interval between the first voltage interconnection and the first differential signal interconnection and is longer than an interval between the second differential signal interconnection and the second voltage interconnection. When a first connection point and a second connection point nearest to the first connection point are provided on any of the first and second differential signal interconnections and the first and second voltage interconnections, a distance between the first connection point and the second connection point is in a range of $\frac{1}{16}$ of a wavelength of the differential signal to $\frac{1}{8}$ of the wavelength thereof.

15 Claims, 15 Drawing Sheets

(51) Int. Cl.
*H01L 23/66* (2006.01)
*H01L 23/00* (2006.01)

(52) U.S. Cl.
CPC ............... *H01L 2224/48091* (2013.01); *H01L 2224/49171* (2013.01); *H01L 2224/73265* (2013.01); *H01L 2924/30107* (2013.01); *H01L 2924/3025* (2013.01)

(56) References Cited

U.S. PATENT DOCUMENTS

| | | | | |
|---|---|---|---|---|
| 6,650,014 | B2 * | 11/2003 | Kariyazaki | 257/737 |
| 6,937,480 | B2 * | 8/2005 | Iguchi et al. | 361/780 |
| 6,969,268 | B2 * | 11/2005 | Brunker et al. | 439/108 |
| 7,009,282 | B2 | 3/2006 | Golick | |
| 7,245,503 | B2 * | 7/2007 | Koga | 361/760 |
| 7,467,955 | B2 | 12/2008 | Raistrick et al. | |
| 7,854,368 | B2 * | 12/2010 | Kwark et al. | 228/180.5 |
| 7,936,053 | B2 * | 5/2011 | Punzalan et al. | 257/670 |
| 8,039,947 | B2 * | 10/2011 | Punzalan et al. | 257/692 |
| 8,063,480 | B2 * | 11/2011 | Mukaibara | 257/691 |
| 8,084,848 | B2 * | 12/2011 | Lee | 257/666 |
| 8,159,052 | B2 * | 4/2012 | Lao et al. | 257/666 |
| 2002/0176236 | A1 | 11/2002 | Iguchi et al. | |
| 2003/0011071 | A1 | 1/2003 | Kariyazaki | |
| 2005/0116013 | A1 | 6/2005 | Kwark et al. | |
| 2007/0200218 | A1 | 8/2007 | Mukaibara | |
| 2008/0214029 | A1 * | 9/2008 | Lemke et al. | 439/108 |
| 2008/0248693 | A1 * | 10/2008 | Winings et al. | 439/608 |
| 2009/0191756 | A1 * | 7/2009 | Hull et al. | 439/607.05 |
| 2011/0180942 | A1 * | 7/2011 | Oikawa | 257/786 |
| 2011/0198742 | A1 * | 8/2011 | Danno et al. | 257/676 |
| 2011/0317384 | A1 * | 12/2011 | Makaibara | 361/764 |
| 2012/0168928 | A1 | 7/2012 | Lao et al. | |

OTHER PUBLICATIONS

Edward Pillai, et al., "Novel T-Coil Structure and Implementation in a 6.4-Gb/s CMOS Receiver to Meet Return Loss Specifications", Electronic Components and Technology Conference, 2007, pp. 147-153.

Ryuichi Oikawa, "Package Substrate Built-In Three-Dimensional Distributed Matching Circuit for High-Speed SerDes Applications", Electronic Components and Technology Conference, 2008, pp. 676-682.

Communication dated Aug. 22, 2014, issued by the State Intellectual Property of the People's Republic of China in corresponding Chinese Application No. 201110034181.6.

* cited by examiner

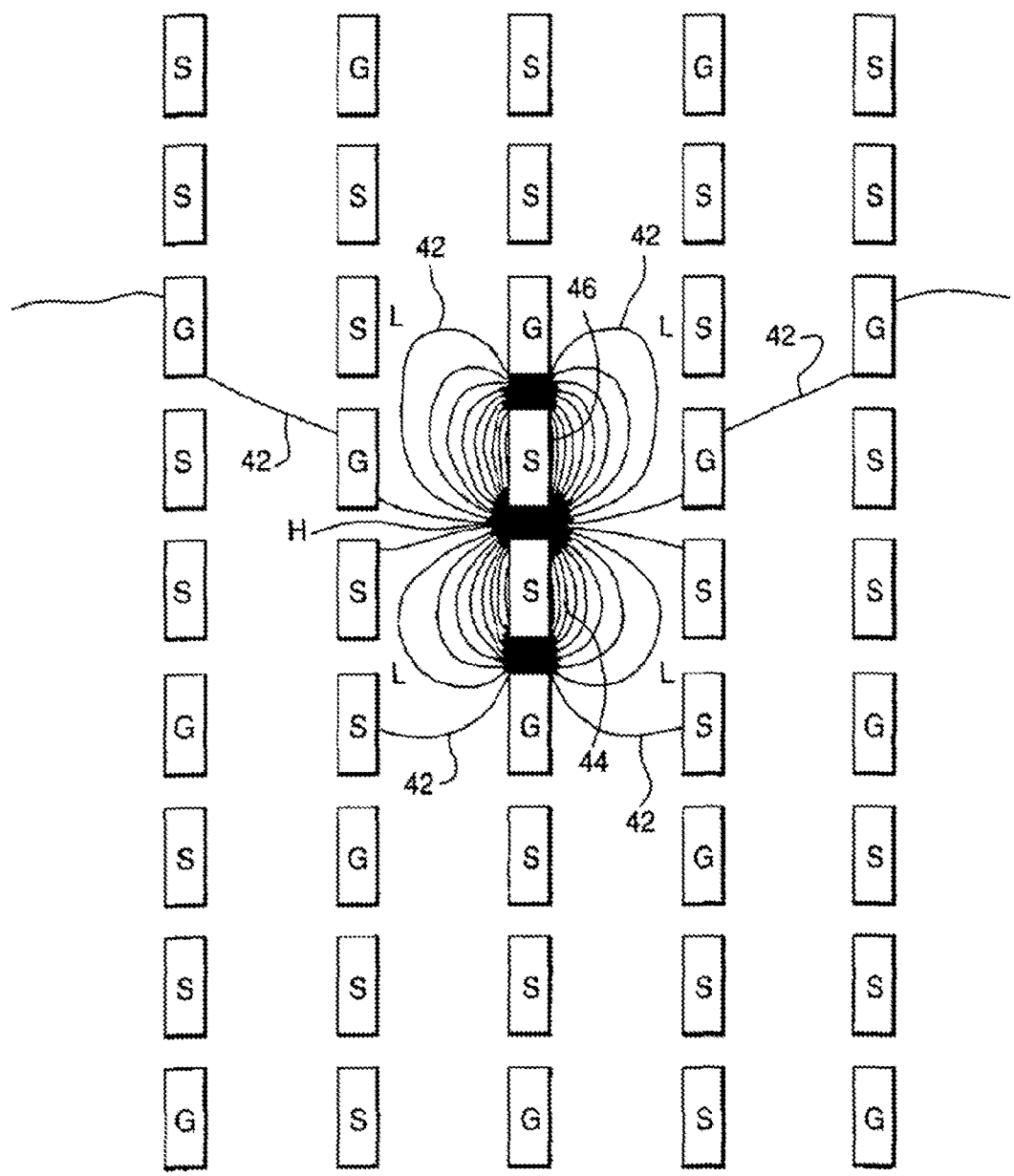

INTERCONNECTION STRUCTURE

INCORPORATION BY REFERENCE

This patent application claims a priority on convention based on Japanese Patent Application No. 2010-16444 filed on Jan. 28, 2010. The disclosure thereof is incorporated herein by reference.

TECHNICAL FIELD

The present invention is related to an interconnection structure, and especially, to an interconnection structure of an electronic apparatus such as a semiconductor device, and a design method of the interconnection structure.

BACKGROUND ART

In recent years, the operation speed of a semiconductor device increases remarkably. Especially, a semiconductor device which can transmit a signal in a high transmission rate of 5 Gbps or more in a low cost is demanded. Accordingly, a semiconductor package and interposer package with high performance in a low cost are required in order to protect the semiconductor chip and to connect with a system board.

The interposer package which is provided with a stripline or a micro stripline in many printed circuit boards has advantageous electric properties in transmission of a signal in a high transmission rate. However, such an interposer package is expensive as compared with a lead frame-type package such as QFP (Quad Flat Package) which is conventionally used.

Therefore, a trial has been made to transmit a signal in a high transmission rate by using a lead frame-type package of a low cost, as described in Non-Patent Literature 1, "Design of Low Cost QFP Packages for Multi-Gigabit Memory Interface" (Proceedings of 59th Electronic Components and Technology Conference, 1662 (2009)) by Joong-Ho Kim, Ralf Schmitt, Dan Oh, Wendemagegnehu T. Beyene, Ming Li, Arun Vaidyanath, Yi Lu, June Feng, Chuck Yuan, Dave Secker, and Don Mullen.

However, in the lead frame-type package which does not have a plane conductor as a reference (a return path), basically, impedance of a signal lead pin is high. Also, in such a signal lead pin, coupling with another lead pin is strong. For this reason, it is difficult to transmit the signal in the high transmission rate of 5 Gbps or more in high quality.

In order to solve this problem, in Patent Literature 1 (U.S. Pat. No. 6,576,983), a special structure of the semiconductor package having a signal reference plane is proposed. FIG. 1 is a section view showing the structure of the semiconductor package disclosed in Patent Literature 1.

However, the structure disclosed in Patent Literature 1 is expensive. Accordingly, it is desirable to achieve signal transmission in the high transmission rate by using as many existing manufacturing processes as possible.

Generally, the lead frame type package has basic problems. The first problem is in that the lead frame-type package does not have a conductor as the reference for the signal transmitted in the high transmission rate. The second problem is in that the coupling between two neighbor signal pins is very strong. Because of these two problems, the impedance of a signal pin is high so that a large signal reflection occurs and also a large inter-signal interference (crosstalk) occurs. As a result, a signal waveform degrades to cause a data detection error.

The property peculiar to the lead frame-type package causes a problem when differential signal interconnection generally used in a device having a transmission rate of Gbps or more is configured. This is because the coupling between two lead pins for a differential signal is too strong.

To perform transmission in a high transmission rate, it is required to appropriately control impedances in two modes in the differential signal, i.e. a differential mode and a common mode. Here, the impedance in the differential mode is smaller than twice of the impedance of a single signal pin due to the coupling between signal pins. For the same reason, the impedance in the common mode is larger than a half of the impedance of the single signal pin. Also, as the coupling between the signal pins becomes stronger, the deviation from twice or the half becomes larger. It should be noted that an ideal value of the differential mode impedance is 100Ω and an ideal value of the common mode impedance is 25Ω.

It could be easily understood that the lead frame-type package in which the coupling between the signal pins is strong has a very high common mode impedance, because even the impedance of the single pin is high.

Generally, when the common mode impedance in a signal route to an input/output circuit on a semiconductor device is very high, large common mode noise generates on the signal route. This causes the generation of EMI (ElectroMagnetic Interference). This mechanism could be understood as follows.

Ideally, a differential signal output circuit should output only an ideal differential signal. However, in an actual circuit, some amount of common mode signal is generated. This common mode signal is divided in voltage based on an impedance ratio of the output impedance of the output circuit and the impedance of the signal route. Generally, in a GHz band, the impedance of the output circuit is low because of its parasitic capacitance. Therefore, when the impedance of the signal route is high, the common mode signal is taken out to the signal route in efficiency near to 100%. That is, an unwanted common mode signal (to be sometimes referred to as a common mode noise because it is unnecessary) causing the EMI is efficiently appeared on the signal route.

Moreover, according to the definition of the impedance, the fact that the common mode impedance in the signal route is high means that the signal route efficiently converts a noise current introduced from the vicinity into the common mode noise. The noise current is mainly induced due to a magnetic field generated from the signal route. Though it has been described above that electromagnetic radiation is easily generated when the common mode impedance is high, it could be understood that the sensitivity to the electromagnetic radiation, too, is high. That is, though it is not only easy to generate the electromagnetic radiation, but also weak to the electromagnetic radiation. Therefore, it is easy to understand that there occurs positive feedback. It is important to control the common mode impedance in addition to the crosstalk.

When a signal transmission is performed in the transmission rate of 5 Gbps or more, the degradation of a signal waveform due to a parasitic capacitance of the I/O circuit regardless of a kind of a package or an interposer will be described in Non-Patent Literature 2, i.e. "Novel T-Coil Structure and Implementation in a6.4-Gb/s CMOS Receiver to Meet Return Loss Specification" (Proceeding of 57th Electronic Components and Technology Conference, 147 (2007)) by Edward Pillai, and Jonas Weiss and Non-Patent Literature 3, i.e. "Package Substrate Built-In Three-Dimensional Distributed Matching Circuit for high-Speed SerDes Applications" (Proceeding of 58th Electronic Components and Technology Conference, 676 (2008)) by Ryuichi Oikawa.

Non-Patent Literature 2 describes a measure on an LSI circuit. Non-Patent Literature 3 describes a measure on a package/interposer. These measures have merits and demerits. However, the measures on the package and interposer are desirable for the purpose that the measures are achieved by using conventional manufacturing technique as much as possible in a low cost.

As discussed above, it is necessary to solve the above problems of the signal degradation due to the absence of the signal reference, the large signal crosstalk, the high common mode impedance, and the parasitic capacitance of the I/O circuit, in order to achieve the high-speed signal transmission of 5 Gbps or more on the lead frame-type package or interposer in low cost.

FIG. 2A is a plan view showing the outward appearance of a semiconductor device disclosed in Patent Literature 2 (U.S. Pat. No. 7,009,282). FIG. 2B is a plan view showing the structure of a lead frame-type package disclosed in Patent Literature 2.

In the conventional techniques shown in FIGS. 2A and 2B, a "pitch extension pin" is provided between two pins. That is, the reduction of crosstalk between the pins is attempted by extending a pin interval partially. There are drawbacks that the number of usable pins is decreased and that footprint is out of a usual design process in mounting on a printed circuit board in this technique. However, because a distance between the pins can be extended several times by providing the pitch extension pin, a crosstalk is considerably reduced.

It is possible to reduce the common mode impedance to a differential signal by assigning the differential signal to two pins provided to have a long interval, although it is not specially described in Patent Literature 2. However, because the impedance per one pin remains high, a large effect is not obtained.

FIG. 3A is a perspective view showing a structure of a two-dimensional array-type connector disclosed in Patent Literature 3 (U.S. Pat. No. 7,467,955). FIG. 3B is a plan view showing interconnection of the two-dimensional array-type connector disclosed in Patent Literature 3.

In the conventional technique shown in FIGS. 3A and 3B, the ground voltage is properly allocated to a part of lead pins at the two-dimensional array-type connector so that the part of lead pins acts as a signal return path or an inter-signal shield. Further, FIG. 3B includes a contour plot of voltage in the neighborhood of an active column-based differential signal pair S– S—in contact arrangement of signal contacts S and ground contacts G. As shown, contour lines 42 are closest to zero volts, contour lines 44 are closest to -1 volt, and contour lines 46 are closest to +1 volt. Even if only one line of the two-dimensional array structures shown in FIGS. 3A and 3B is taken out, the same effect as in the two-dimensional array structure is not obtained, but it would be applicable to a lead frame-type package of a semiconductor device. Also, a method of adjusting a signal pin interval and a signal pin width to adjust impedances and a method of arranging a pair of pins for a differential signal and a pin for the ground voltage alternately to reduce a crosstalk are disclosed in Patent Literature 3. However, a method of controlling common mode impedance is not described in Patent Literature 3 especially.

CITATION LIST

Patent Literature

[Patent Literature 1]: U.S. Pat. No. 6,576,983
[Patent Literature 2]: U.S. Pat. No. 7,009,282
[Patent Literature 3]: U.S. Pat. No. 7,467,955

Non-Patent Literature

[Non-Patent Literature 1]: "Design of Low Cost QFP Packages for Multi-Gigabit Memory Interface" (Proceedings of 59th Electronic Components and Technology Conference, 1662 (2009)) by Joong-Ho Kim, Ralf Schmitt, Dan Oh, Wendemagegnehu T. Beyene, Ming Li, Arun Vaidyanath, Yi Lu, June Feng, Chuck Yuan, Dave Secker, and Don Mullen

[Non-Patent Literature 2]: "Novel T-Coil Structure and Implementation in a 6.4-Gb/s CMOS Receiver to Meet Return Loss Specification" (Proceeding of 57th Electronic Components and Technology Conference, 147 (2007)) by Edward Pillai, Jonas Weiss

[Non-Patent Literature 3]: "Package Substrate Built-In Three-Dimensional Distributed Matching Circuit for high-rate SerDes Applications" (Proceeding of 58th Electronic Components and Technology Conference, 676 (2008)) by Ryuichi Oikawa

SUMMARY OF THE INVENTION

In the above conventional techniques, an attention is paid on the control of inter-signal crosstalk, and a method of reducing common mode impedance is not disclosed although a part can be inferred. Also, in the conventional techniques, any measure to signal degradation due to a parasitic capacitance of an I/O circuit is not provided.

As a problem in the conventional techniques, the number of signal pins is reduced, and a method of changing a 2-dimensional structure into a 1-dimensional structure while maintaining desired performance is not provided.

Therefore, it is demanded to reduce a common mode impedance while removing unnecessary pins without using a special design of a printed circuit board, by using a 1-dimensional array of a lead pin arrangement, and to prevent signal degradation due to a parasitic capacitance of an I/O circuit.

In an aspect of the present invention, an interconnection structure includes: first and second differential signal interconnections provided to transmit a differential signal; and first and second voltage interconnections applied with predetermined voltages. The first voltage interconnection, the first differential signal interconnection, the second differential signal interconnection and the second voltage interconnection are arranged in this order. An interval between the first and second differential signal interconnections is longer than an interval between the first voltage interconnection and the first differential signal interconnection and is longer than an interval between the second differential signal interconnection and the second voltage interconnection. When a first connection point and a second connection point nearest to the first connection point are provided on any of the first and second differential signal interconnections and the first and second voltage interconnections, a distance between the first connection point and the second connection point is in a range of $1/16$ of a wavelength of the differential signal to $1/8$ of the wavelength thereof.

In another aspect of the present invention, a semiconductor device including an interconnection structure which includes: first and second differential signal interconnections provided to transmit a differential signal; and first and second voltage interconnections applied with predetermined voltages. The first voltage interconnection, the first differential signal interconnection, the second differential signal interconnection and the second voltage interconnection are lead pins and arranged in this order. An interval between the first and second differential signal interconnections is longer than an interval between the first voltage interconnection and the first differential signal interconnection and is longer than an interval between the second differential signal interconnection and the second voltage interconnection. When a first connection point and a second connection point nearest to the first connection point are provided on any of the first and second differential signal interconnections and the first and second voltage interconnections, a distance between the first connection point and the second connection point is in a range of $\frac{1}{16}$ of a wavelength of the differential signal to $\frac{1}{8}$ of the wavelength thereof.

Still another aspect of the present invention, a design method of an interconnection structure is provided, and the interconnection structure includes: first and second differential signal interconnections provided to transmit a differential signal; and first and second voltage interconnections applied with predetermined voltages. The first voltage interconnection, the first differential signal interconnection, the second differential signal interconnection and the second voltage interconnection are arranged in this order. The design method includes: setting initial values of an interval between the first voltage interconnection and the first differential signal interconnection, an interval between the first differential signal interconnection and the second differential signal interconnection, and an interval between the second differential signal interconnection and the second voltage interconnection; calculating a crosstalk and common mode impedance based on the intervals; changing any of the intervals when at least one of the crosstalk and the common mode impedance does not meet a predetermined condition; and repeating the calculating and the changing until both of the crosstalk and the common mode impedance meet the predetermined condition. The setting includes: when it is supposed that the interval between the first voltage interconnection and the first differential signal interconnection or the interval between the second differential signal interconnection and the second voltage interconnection is set as a first interval and the interval between the first differential signal interconnection and the second differential signal interconnection is set as a second interval, setting a ratio of the first interval to the second interval to be 1 to 2.

The present invention can attain the effect which could not be attained in any conventional techniques, through a distributed constant design by using a phase difference of a transmission signal, and by using a part of a package lead pins for a power supply pin or a ground pin which functions as a return path, and appropriately controlling lengths and intervals of the lead pins.

BRIEF DESCRIPTION OF DRAWINGS

The above and other objects, advantages and features of the present invention will be more apparent from the following description of certain embodiments taken in conjunction with the accompanying drawings, in which:

FIG. 3B is a plan view showing interconnection of the conventional two-dimensional array-type connector;

DESCRIPTION OF EMBODIMENTS

Hereinafter, an interconnection structure of a semiconductor device according to the present invention will be described with reference to the attached drawings.

[First Embodiment]

Figure 1:
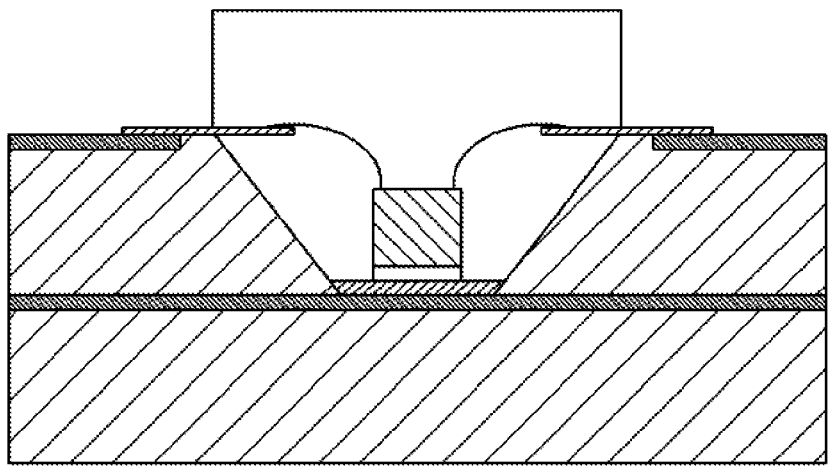
FIG. 1 is a section view showing a structure of a conventional semiconductor package.
Figure 2A:
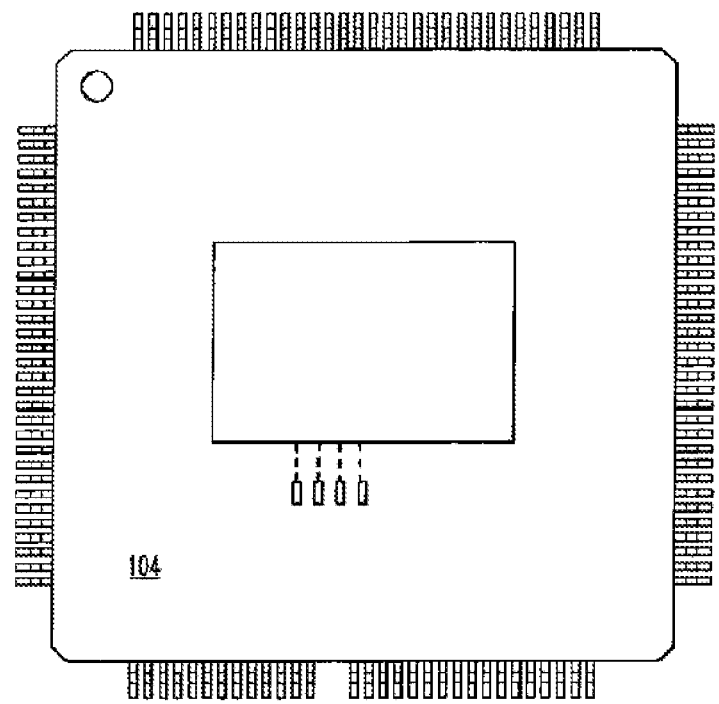
FIG. 2A is a plan view showing the outward appearance of a conventional semiconductor device.
Figure 2B:
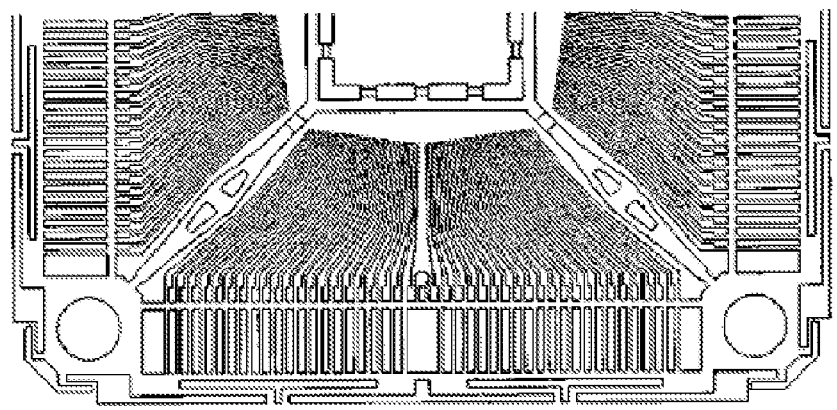
FIG. 2B is a plan view showing the structure of a lead frame-type package used in the conventional semiconductor device in FIG. 2A.
Figure 3A:
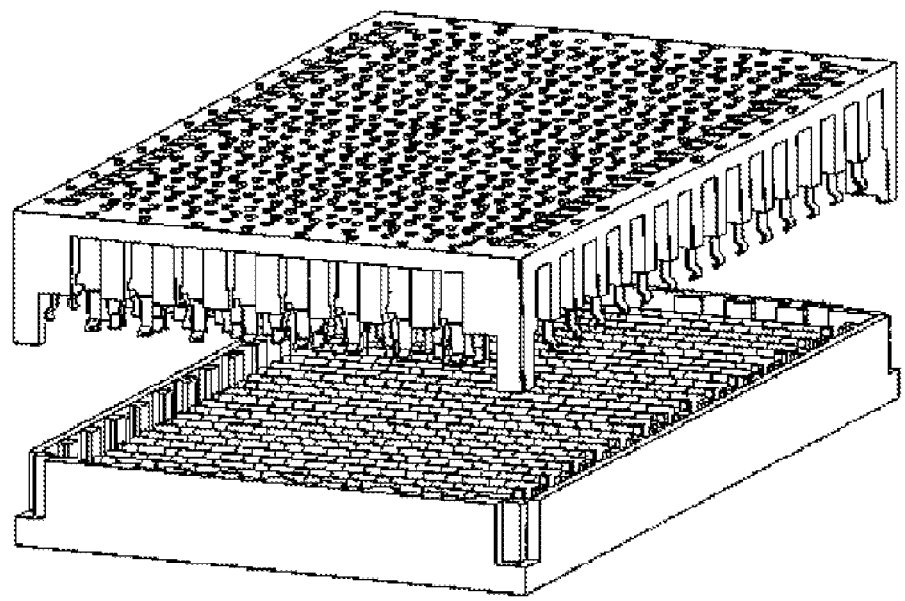
FIG. 3A is a perspective view showing a structure of a conventional two-dimensional array-type connector.
Figure 4A:
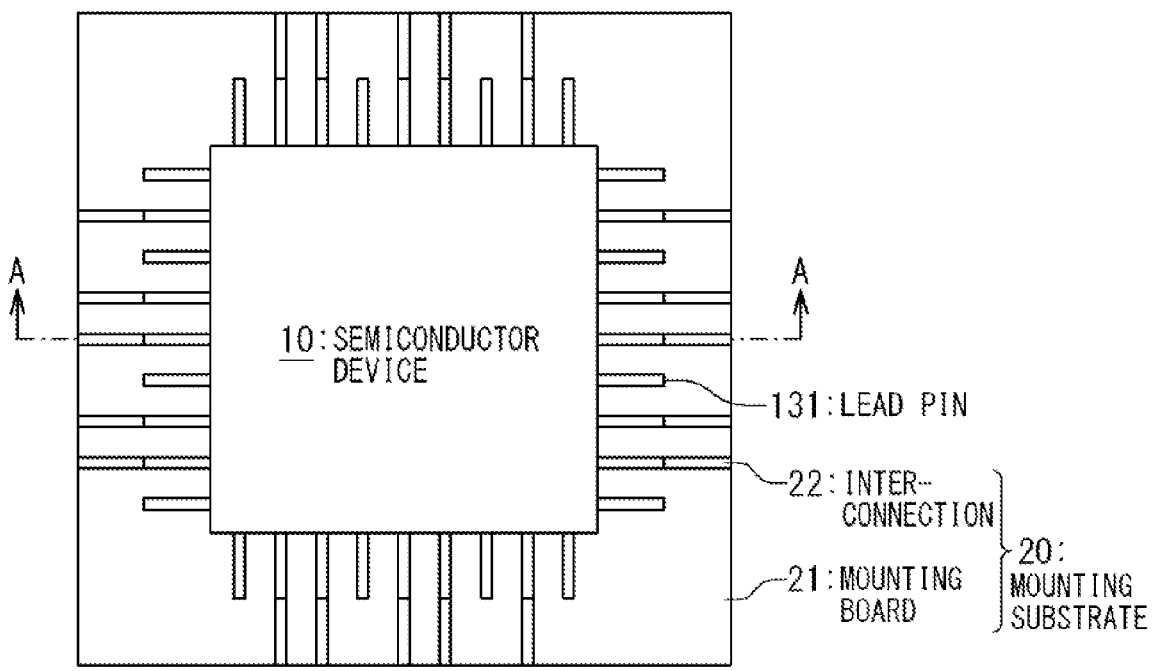
FIG. 4A is a plan view showing a semiconductor device and a mounting substrate 20 to which an interconnection structure according to a first embodiment of the present invention is applied.
Figure 4B:
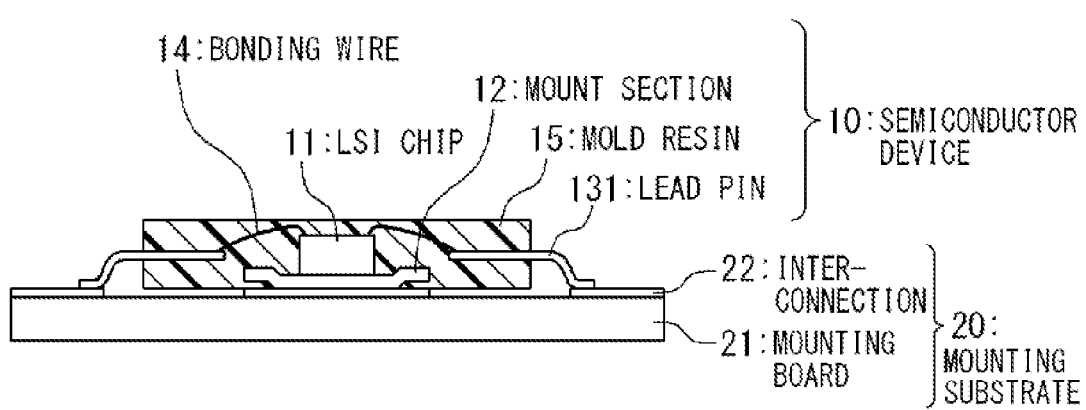
FIG. 4B is a sectional view of the semiconductor device and the mounting substrate along the line A-A' in FIG. 4A.

FIG. 4A is a plan view showing a semiconductor device 10 and a mounting substrate 20 to which the interconnection structure according to a first embodiment of the present invention is applied. FIG. 4B is a sectional view of the semiconductor device and the mounting substrate along the line A-A' in FIG. 4A.

The semiconductor device 10 and mounting substrate 20 in FIGS. 4A and 4B will be described. The semiconductor device 10 is provided with an LSI chip 11, a mount section 12, lead pins 131, bonding wires 14 and mold resin 15. Also, the mounting substrate 20 is provided with a mounting board 21 and interconnections 22.

The LSI chip 11 is mounted on the mount section 12. A plurality of lead pins 131 are arranged around the mount section 12. Connection pads (not shown) of the LSI chip 11 are connected with lead pins 131 or the mount section 12 by bonding wires 14. The mold resin 15 wraps the LSI chip 11, the mount section 12 and a part of the lead pins 131 and the bonding wires 14. Another part of the lead pins 131 come out of the mold resin 15. The interconnection patterns 22 are arranged on the surface of the mounting board 21. A tip of the other part of the lead pin 131 is connected with the interconnection pattern 22.

Figure 5A:
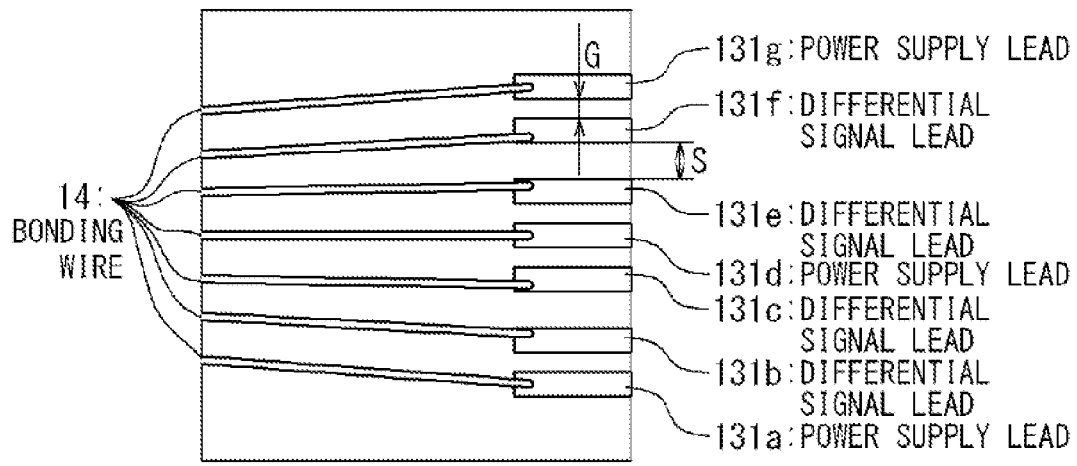
FIG. 5A is a plan view partially showing the interconnection structure according to the first embodiment of the present invention.
Figure 5B:
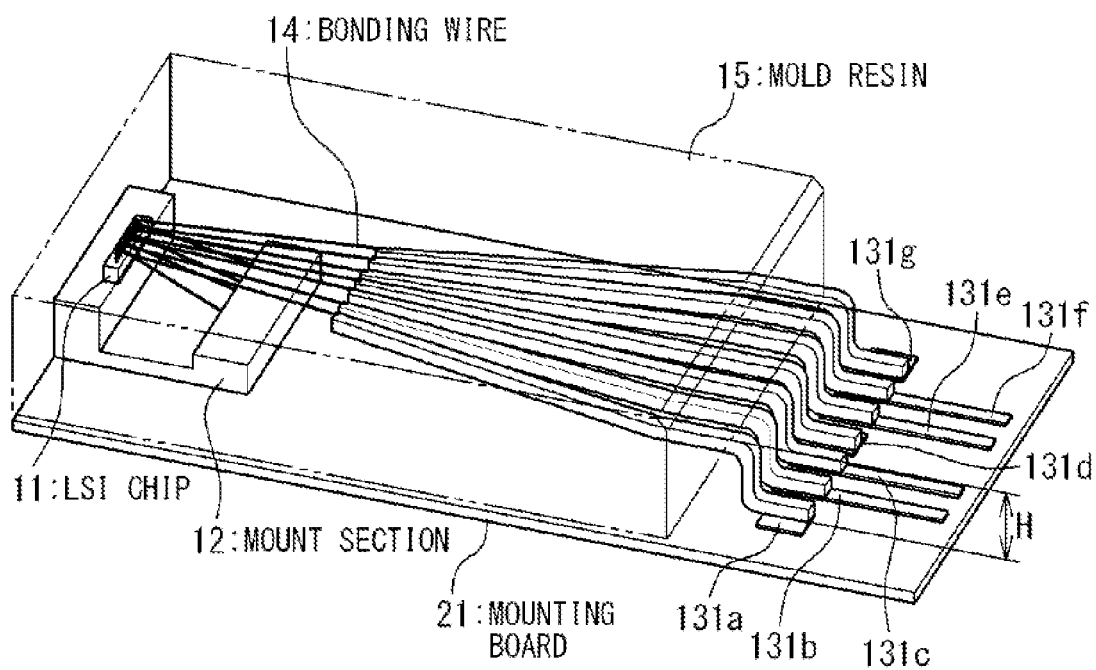
FIG. 5B is a perspective view partially showing the interconnection structure according to the first embodiment of the present invention.

FIG. 5A is a plan view partially showing the interconnection structure according to the first embodiment of the present invention. FIG. 5B is a perspective view partially showing the interconnection structure according to the first embodiment of the present invention.

The structure shown in FIG. 5A and FIG. 5B is a part of the interconnection structure shown in FIGS. 4A ad 4B. The interconnection structure shown in FIGS. 5A and 5B is provided with the first to seventh lead pins 131a to 131g. The first, fourth, and seventh lead pins 131a 131d, and 131g are used as power supply lead pins which supply predetermined voltages or ground lead pins which supply the ground voltage. The second, third, fifth, and sixth lead pins 131b, 131c, 131e, and 131f are used as pairs of lead pins for differential signals. Here, the second and third lead pins 131b and 131c are a pair of lead pins for a first differential signal. Also, the fifth and sixth lead pins 131e and 131f are a pair of lead pins for a second differential signal.

In the present embodiment, the two lead pins 131b and 131c are arranged in adjacent to each other. Also, the two power supply lead pins 131a and 131d are arranged to put the two lead pins 131b and 131c for the first differential signal between the lead pins 131a and 131d. In other words, the first power supply lead pin 131a, the first differential signal lead pin 131b, the second differential signal lead pin 131c, and the second power supply lead pin 131d are arranged in this order.

A part of various lead pins 131 which is out of the mold resin 15 is connected with the mounting substrate 20 and is referred to as an outer lead pin part. In an initial state in the present embodiment, an interval between the outer lead pins is constant. In other words, in the initial state in the present embodiment, the outer lead pins are arranged in a same pitch.

It is supposed that a distance between signal lines for one differential signal is S. Also, it is supposed that a distance between the signal lead pin for the differential signal and a power supply lead pin adjacent to the signal lead pin is G. Further, it is supposed that a height of the outer lead pin is H.

In the present embodiment, the power supply lead pin which neighbors the differential signal lead pin functions as the return path for the signal transmitted through the differential signal lead pin. Therefore, instead of the two power supply lead pins, two ground lead pins may be used. However, in case of FIGS. 4A, 4B, 5A and 5B, a so-called exposed die-pad structure is employed and the ground is straightly under an LSI die. That is, because the ground lead pin is not required, the power supply lead pin is used as the return path in FIGS. 4A, 4B, 5A and 5B.

A co-planar structure is employed for the two lead pins for the differential signal and the two power supply lead pins in the present embodiment. In this co-planar structure, the return path impedance is relatively high. The return path is provided by the power supply lead pin which neighbors the signal lead pin. In a case of H>>G, the impedance in a single end mode is uniquely determined based on G. It is possible to set the signal to return path spacing G approximately to the width of the lead pin so that too high the single end mode impedance can be reduced to improve the signal transmission characteristic.

As mentioned above, in the lead frame-type package, the coupling between the lead pins is considerably strong. By using the coupling in this structure, the common mode impedance can be brought close to 25Ω which is a desired value. For the purpose, G is set to be sufficiently smaller than S. The reduction of G causes the increase of S when keeping a total of the lead pin pitches S+G constant. At this time, the coupling between the differential signal lead pins becomes weak and the coupling between the signal lead pin and the power supply lead pin becomes strong. As a result, the common mode impedance is reduced.

The pair of lead pins 131b and 131c for the first differential signal and the pair of lead pins 131e and 131f for the second differential signal are arranged as shown in FIGS. 5A and 5B. The second power supply lead pin 131d is arranged between the two pairs of lead pins for the differential signals. The power supply lead pin 131d is the return path for the first differential signal, and also the return path for the second differential signal. In other words, the power supply lead pin 131d is shared by the two differential signals. The power supply lead pin 131d functions as a shield between the two differential signals. That is, a crosstalk between the two differential signals is restrained through existence of the power supply lead pin 131d. Moreover, because the power supply lead pin 131d functions as the return path for two signals, the number of pins can be reduced in the semiconductor device.

In the present invention, an optimal ratio of S to G exists. For example, when increasing S and decreasing G, the common mode impedance decreases whereas the crosstalk increases. This is because the distance between the adjacent differential signal lead pins (accurately, between the two lead pins near to each other of the differential signal pins each contained in the different differential signal pairs) becomes small. Oppositely, when decreasing S and increasing G, the crosstalk reduces whereas the common mode impedance starts to increase. Originally, the common mode impedance is already inappropriately high under the condition of S=G. Therefore, when the crosstalk and the common mode impedance are balanced well, an optimal ratio meets the following relation:

$$0 < G/S < 1.$$

When various cases are analyzed by using an electromagnetic field simulator, the optimal ratio meets the following relation in many cases:

$$G/S \approx 1/2.$$

Therefore, when optimizing the interconnection structure of the present invention, the initial value of G/S=1/2 is the most efficient.

Figure 12:
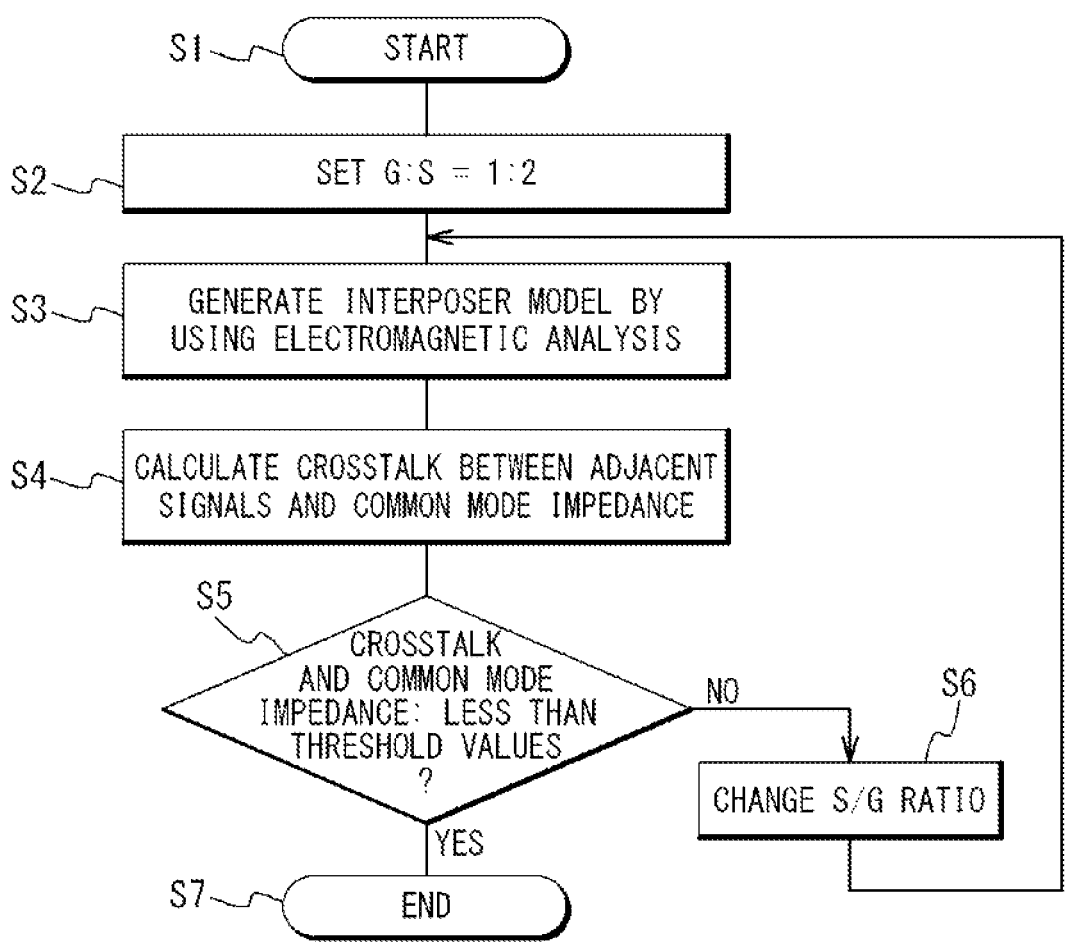
FIG. 12 is a flow chart showing an interconnection structural designing method of the present invention.

FIG. 12 is a flow chart showing an interconnection structural designing method of the present invention.

Step S1:

The interconnection structure designing method of the present invention is started at a step S1.

Step S2:

The initial value of G:S=1:2 is set.

Step S3:

An interposer model is generated through the electromagnetic field analysis.

Step S4:

The crosstalk and common mode impedance between the neighbor first and second differential signals are calculated. It should be noted that as the common mode impedance, the return loss in the common mode may be actually calculated.

Step S5:

Whether or not the common mode impedance and the crosstalk are smaller than preset values are confirmed, respectively. When either of the crosstalk or the common mode impedance exceeds the preset value, the step S6 is executed. When both of the crosstalk and the common mode impedance meet the above conditions, the step S7 is executed.

Step S6:

The values of G and S are changed. Specifically, in order to decreasing the crosstalk, S is decreased and G is increased. Also, in order to decreasing the common mode impedance, S is increased and G is decreased. Here, both of the crosstalk and the common mode impedance cannot be decreased at a same time. Therefore, it is necessary to determine which of the crosstalk and the common mode impedance to decrease primarily individually in advance based on the LSI using the interconnection structure. Then, the control flow returns to the step S3.

Step S7:

The interconnection structure designing method of the present invention is ended.

Next, an impedance matching operation in the present invention will be described. The output impedance of the LSI circuit is generally smaller due to a parasitic capacitance of an I/O circuit than 50Ω. In the present invention, the output impedance is made to be matched to a value in the neighborhood of 50Ω, when viewing from the mounting substrate, namely, from the outer lead pins. It should be noted that one feature of the present invention is in the impedance matching operation.

The impedance of the return path lead pin which is viewed from the LSI pad increases because of its own inductance as the frequency rises higher, and takes a maximum value when the length of the lead pin reaches ¼ of a transmission signal wavelength. The lead pin functioning as the return path is connected with the power supply line or the ground line on the mounting substrate. Because the voltage amplitude on the lead pin becomes smallest at the tip of the outer lead pin, the amplitude voltage becomes maximum at a point which is apart from the tip by ¼ wavelength of the transmission signal, i.e. the impedance becomes maximum. Therefore, the impedance becomes maximum at an end of the lead pin on the LSI side. Because the end of the lead pin on the LSI side is a connection point with the bonding wire, the impedance at this point is the impedance of the bonding wire.

When the impedance of the return path increases, the coupling between the lead pins for the differential signal becomes strong. At this time, the differential mode impedance viewed from the LSI side with respect to the external ground, e.g. the ground point on the mounting substrate changes in a falling direction. On the other hand, because the impedance of the return path viewed from the external ground increases, the differential mode impedance with respect to the return path lead pin first decreases as the lead pin length becomes longer, but then gradually increases, and reaches the maximum value at a point of ¼ of the wavelength of the differential signal. Therefore, the differential mode impedance with respect to the return path lead pin is minimized at some point from 0 to ¼ of the wavelength of the differential signal. In very rough approximation, the differential mode impedance is minimized at a point of ⅛ of the wavelength of the differential signal which is at the middle exactly.

As mentioned above, the output impedance of the I/O output circuit has a low value in the GHz band. Here, it is assumed that an imaginary part of the impedance of the lead pin is set approximately to −1 times of the imaginary part of the impedance of the I/O output circuit. That is, the impedance of the lead pin and the impedance of the I/O output circuit are set to have a complex conjugate relation. Thus, the impedance of the I/O output circuit and the impedance of the lead pin are matched to each other. At this time, the value of about 50Ω is obtained as an impedance of the lead pin when viewed from the outer lead pin side.

In the actual case, an equivalent circuit of the output impedance of the I/O output circuit is approximately expressed as an RC parallel circuit. Therefore, the impedance matching is performed at a point nearer to the tip rather than the point of the ⅛ wavelength of the differential signal. The point is in a range of ⅛ wavelength to 1/16 wavelength of the differential signal in many cases. Also, in order to perform the impedance matching in a broadband, so-called Q-value must be made small. For the purpose, the inductance of the return path lead pin needs to be made rather small. In this way, the optimal lead pin length becomes shorter than the ⅛ wavelength of the differential signal from the viewpoint of the broadband design.

In the configurations of FIGS. 5A and 5B, the differential mode impedance becomes the highest at the ¼ wavelength of the differential signal, i.e. the transmission characteristic deteriorates, as the side effect. The value in this case is indeed the impedance of the tip of the bonding wire on the lead pin side. In order to reduce this side effect, it is enough to lower the impedance and to set the ¼ wavelength frequency sufficiently high. The wire is arranged to couple the power supply lead pin and the ground lead pin in order to lower impedance the length is controlled. Also, it should bring a lead pin close to the 1/16 wavelength by adjusting the lead pin length to set a ¼ wavelength frequency sufficiently high.

Figure 6:
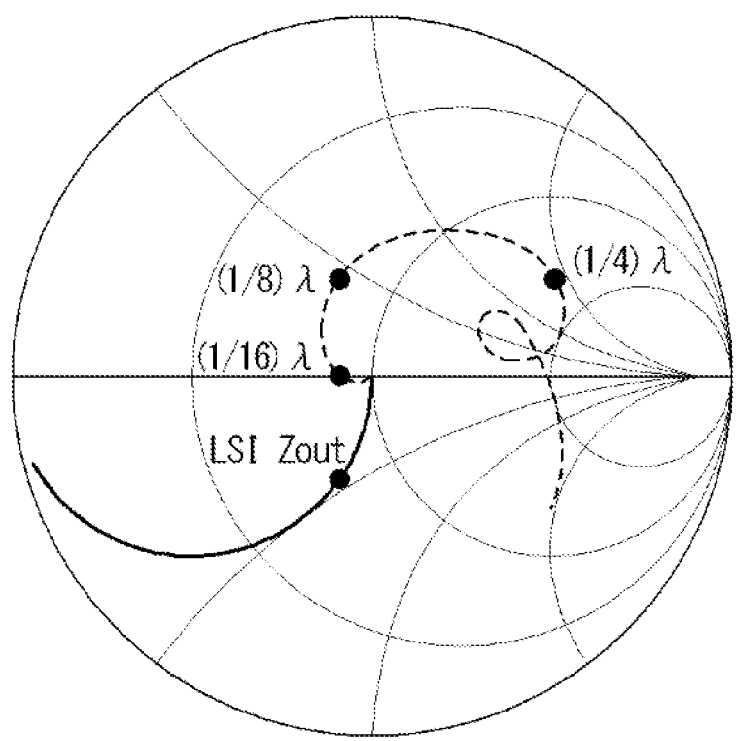
FIG. 6 is a Smith chart showing a track of impedance in the present invention.

FIG. 6 is a Smith chart showing a trace of the impedance in the present invention. This Smith chart shows the result of the calculation, including a bonding wire. The points on FIG. 6 show the impedances of the semiconductor package which is viewed from the LSI side at the ratios (1/4, 1/8, 1/16) and the output impedance (LSI Zout) of the LSI at the operation frequency and the differential signal wavelength (λ). The following matters are observed from this Smith chart. First, at the ¼ wavelength, the impedance is maximized. Next, near the ⅛ wavelength, it approaches the complex conjugate of the output impedance of the LSI (symmetrical with respect to the X-axis). Moreover, near the 1/16 wavelength, it has the impedance which is near the pure resistance.

Therefore, to suppress a Q-value and to perform a broadband matching, the length of the lead pin is set to be between the ⅛ wavelength of the differential signal and the 1/16 wavelength thereof. In this way, in the present invention, because the frequency characteristic can be controlled according to only the length of the lead pin and be set, there is a feature not to receive influence due to a manufacturing variation.

Figure 7A:
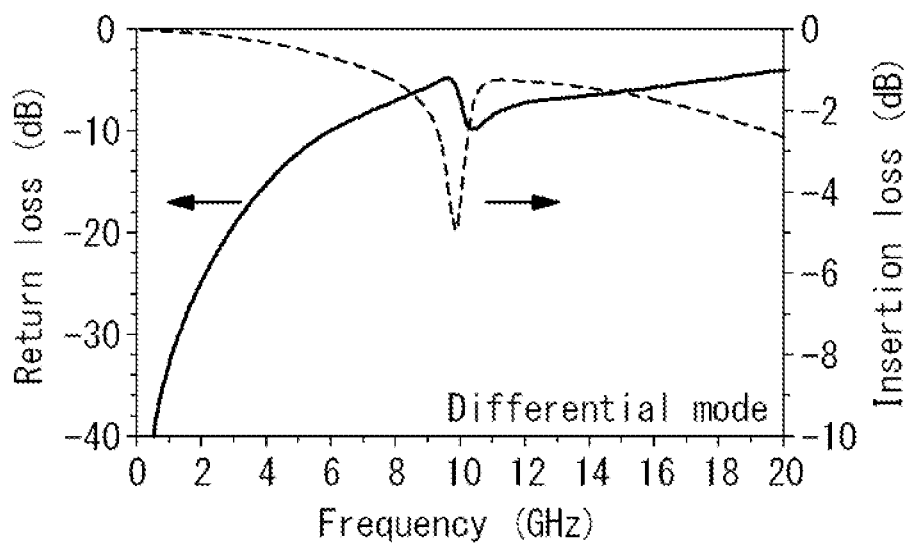
FIG. 7A shows graphs of examples of the frequency response of return loss and insertion loss in a differential mode of a lead frame-type package designed according to the present invention.
Figure 7B:
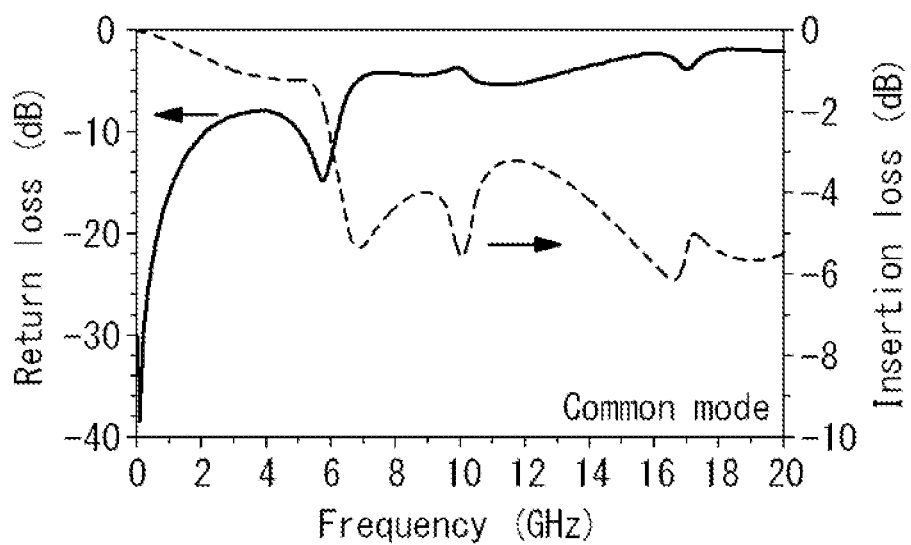
FIG. 7B shows graphs of examples of the frequency response of reflection loss and insertion loss in a common mode of the lead frame-type package designed according to the present invention.
Figure 7C:
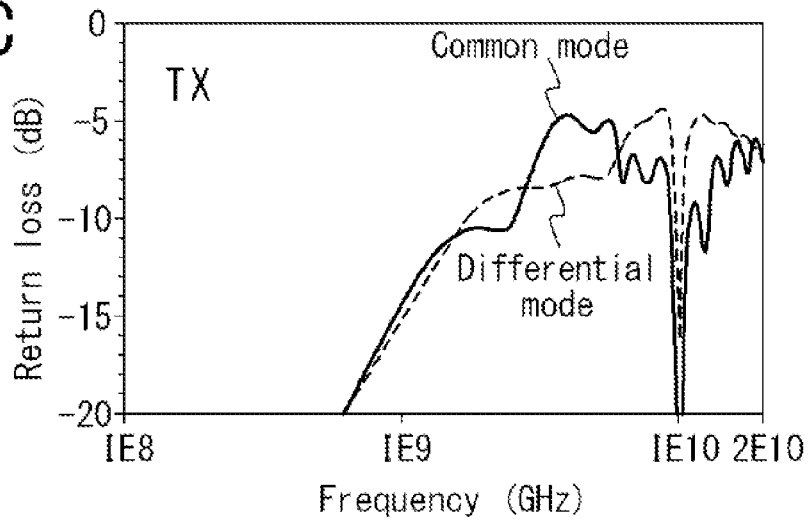
FIG. 7C shows graphs of measuring results of return loss as impedance in an LSI mounting state when the lead frame-type package designed according to the present invention is viewed from the side of a mounting substrate.
Figure 7D:
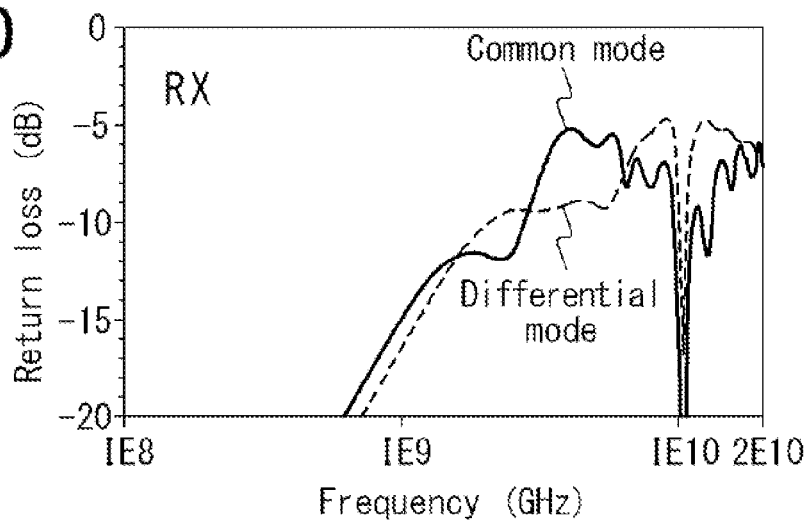
FIG. 7D shows graphs of measuring results of return loss as impedance in the LSI mounting state when the lead frame-type package designed according to the present invention is viewed from the side of the mounting substrate.
Figure 7E:
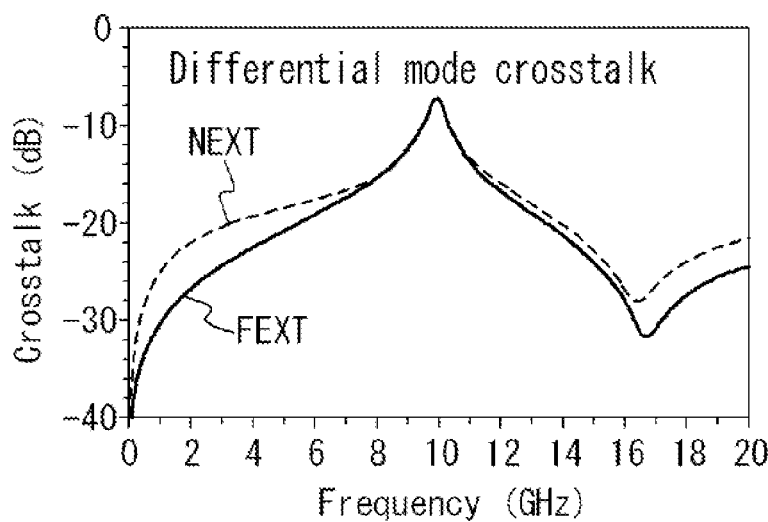
FIG. 7E shows graphs of examples of frequency response of near-end crosstalk and far-end crosstalk in the differential mode of the lead frame-type package designed according to the present invention.

FIG. 7A shows graphs of examples of the frequency response of return loss (reflection loss) and insertion loss in a differential mode of the lead frame-type package designed according to the present invention. FIG. 7B shows graphs of examples of the frequency response of reflection loss and insertion loss in a common mode of the lead frame-type package designed according to the present invention. FIG. 7C shows graphs of the measuring result of the impedance as a return loss in the LSI mounting state when the lead frame-type package designed according to the present invention is viewed from the mounting substrate. Here, the shown impedance is of the output circuit. FIG. 7D shows graphs of the measuring result of impedance as a return loss in the LSI mounting state when the lead frame-type package designed according to the present invention is viewed from the mounting substrate. However, the displayed impedance is of the input circuit. FIG. 7E shows graphs of examples of frequency response of near-end crosstalk (NEXT) and far-end crosstalk (FEXT) in the differential mode of the lead frame-type package designed according to the present invention.

It can be seen from the graphs in FIGS. 7A and 7B that an electronic circuit which has the interconnection structure of the present invention has good transmission characteristics in a high transmission rate of 10 Gbps or more. Excluding that the differential mode transmission characteristics falls locally at the ¼ wavelength frequency, the good transmission characteristics can be attained. Regarding the common mode, it could be seen that the rise of the impedance is restrained to the neighborhood of 5 GHz.

It is seen from the graphs of FIGS. 7C and 7D that there is a plateau in the differential mode curves. This shows that the impedance matching operation functions as expected.

It can be seen from the graph of FIG. 7E that the characteristic is very good in which the crosstalk is at most 1% (−40 dB) up to 3 GHz.

Next, it is shown that one feature of the present invention is in the size control and that the desired effect is not obtained only in the order of merely geometrical arrangement.

Figure 8:
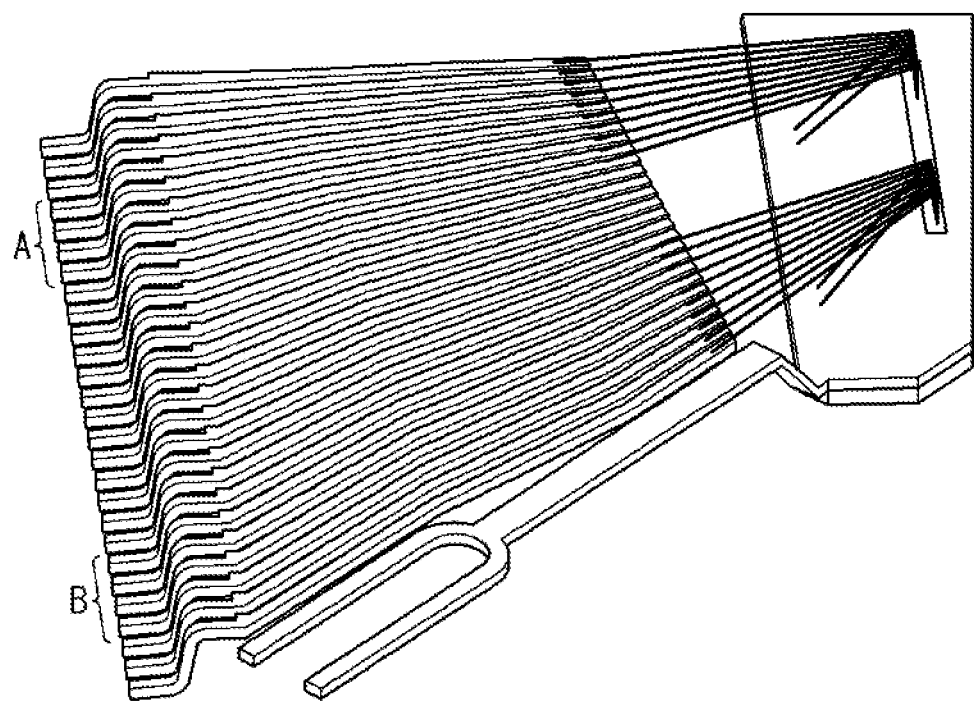
FIG. 8 is a perspective view showing a configuration example of an electronic system when only the lead pin arrangement is set to be the same as the present invention.

FIG. 8 is a perspective view showing a configuration example of an electronic system when only the lead pin arrangement is set to be the same as the present invention. The electronic system of FIG. 8 is provided with the first and second input sections A and B.

Figure 9A:
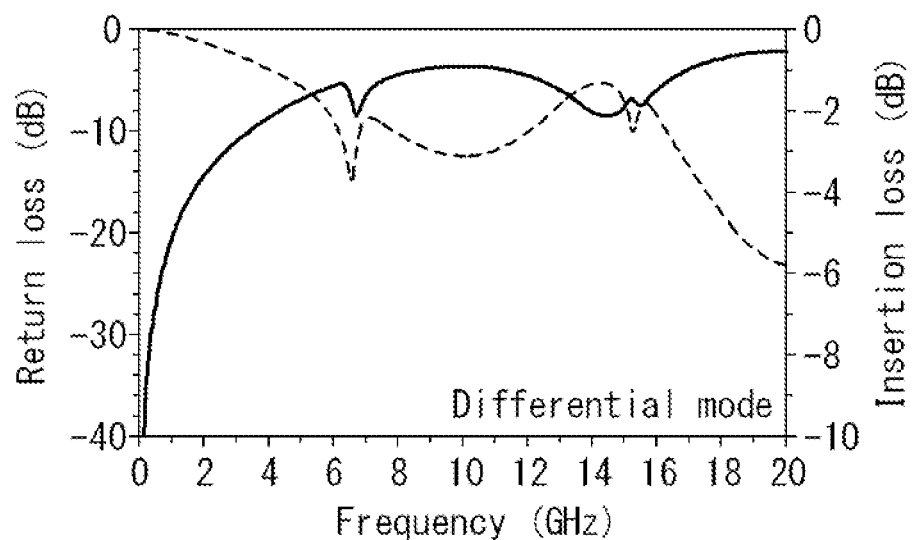
FIG. 9A shows graphs of the frequency response of return loss and insertion loss in the differential mode in a first input section A of the electronic system of FIG. 8.
Figure 9B:
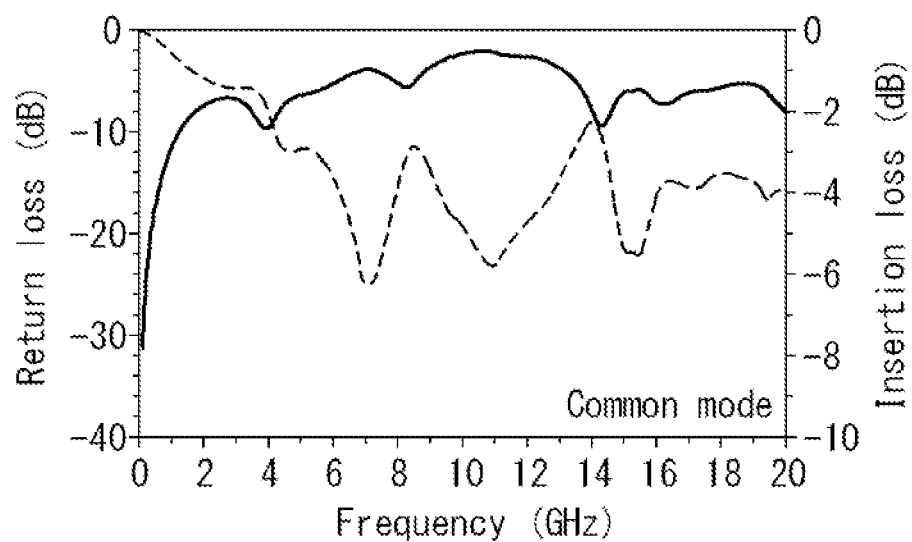
FIG. 9B shows graphs of the frequency response of return loss and insertion loss in the common mode in the first input section A of the electronic system of FIG. 8.
Figure 9C:
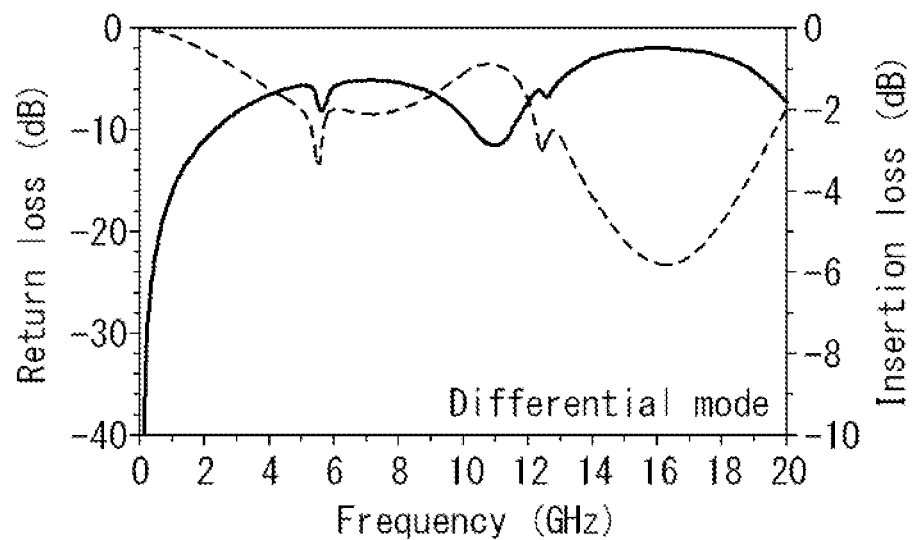
FIG. 9C shows graphs of the frequency response of return loss and insertion loss in the differential mode in a second input section B of the electronic system of FIG. 8.
Figure 9D:
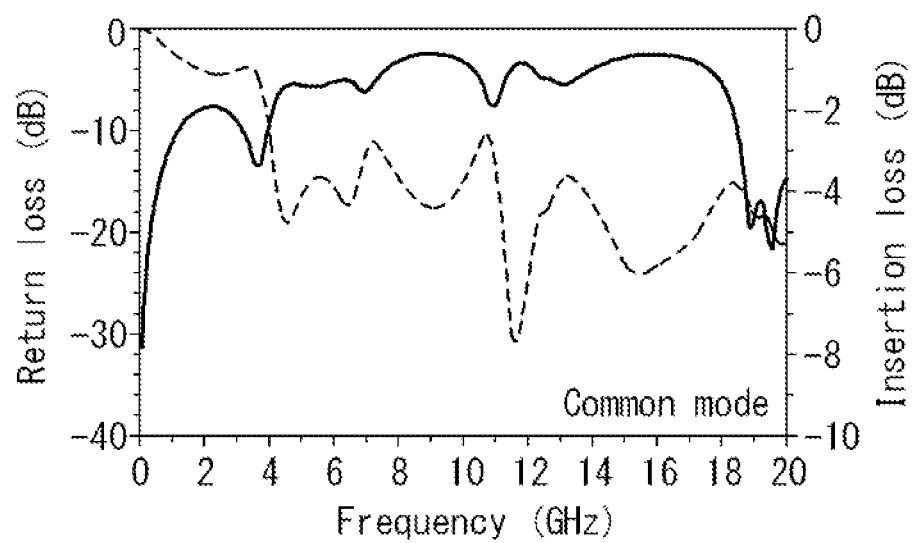
FIG. 9D shows graphs of the frequency response of return loss and insertion loss in the common mode in the second input section B of the electronic system of FIG. 8.

FIG. 9A shows graphs of the frequency response of return loss and insertion loss in the differential mode in the first input section A of the electronic system of FIG. 8. FIG. 9B shows graphs of the frequency response of return loss and insertion loss in the common mode in the first input section A of the electronic system of FIG. 8. FIG. 9C shows graphs of the frequency response of return loss and insertion loss in the differential mode in the second input section B of the electronic system of FIG. 8. FIG. 9D shows graphs of the frequency response of return loss and insertion loss in the common mode in the second input section B of the electronic system of FIG. 8.

It could be seen from FIGS. 9A to 9D that the signal transmission characteristic of the electronic system of FIG. 8 is very different from the present invention. The characteristic is not so good in the differential mode, and is very bad in the common mode. Also, it could be seen that the characteristic difference between two signals is large. These results show that the size control is very important in the present invention.

Figure 10A:
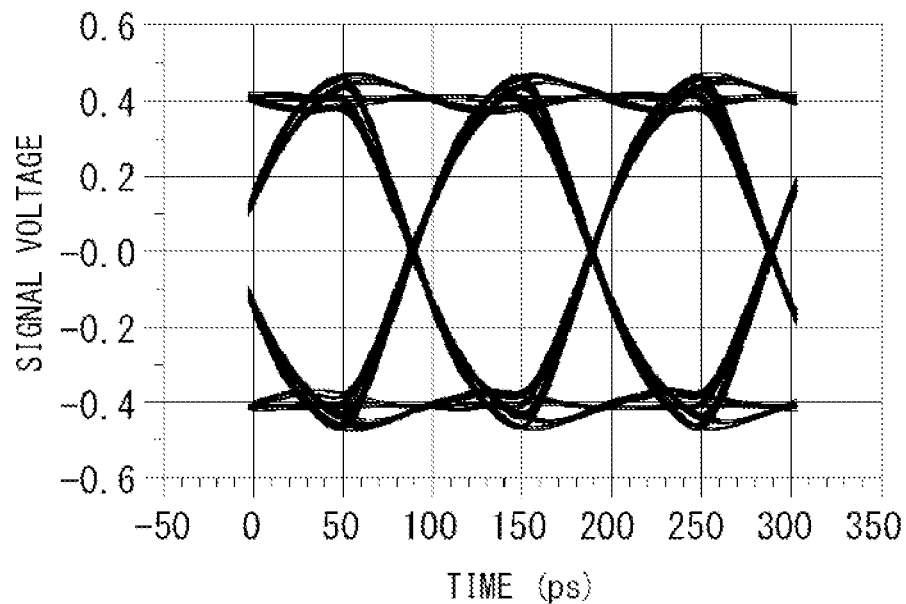
FIG. 10A shows signal waveforms outputted from a lead pin when a semiconductor device having the interconnection structure of the present invention operates at 10 Gbps.
Figure 10B:
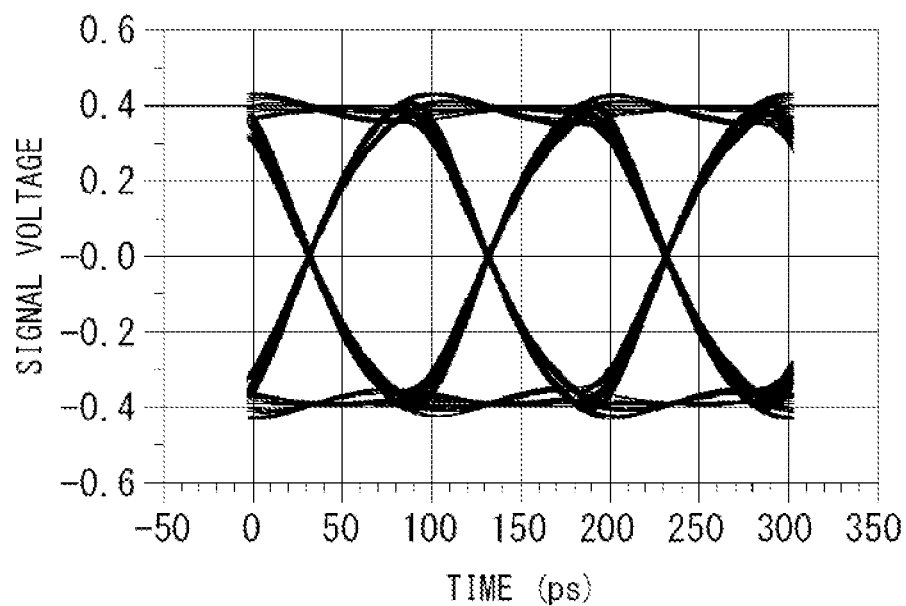
FIG. 10B shows signal waveforms inputted to the mounting substrate when the semiconductor device having the interconnection structure of the present invention operates at 10 Gbps.

FIG. 10A shows signal waveforms outputted from a lead pin when a semiconductor device having the interconnection structure of the present invention operates at 10 Gbps. FIG. 10B shows signal waveforms inputted to the mounting substrate when the semiconductor device having the interconnection structure of the present invention operates at 10 Gbps.

It could be seen from FIGS. 10A and 10B that Eye opening of the signal waveform is good and therefore, the semiconductor device having the interconnection structure of the present invention can cope with the high transmission rate of 10 Gbps or more.

[Second Embodiment]

In the second embodiment of the present invention, the same structure as the first embodiment of the present invention is configured on a transmission line substrate such as a printed circuit board. For this purpose, the whole of a lead frame containing a return path is replaced with striplines or micro striplines so as to have a co-planar structure. Although a power supply or a ground is configured as planes in the stripline or the micro stripline, it is required that an aspect ratio of a width and a length is equal to or less than ½, in order to attain the effect of the present invention.

Figure 11:
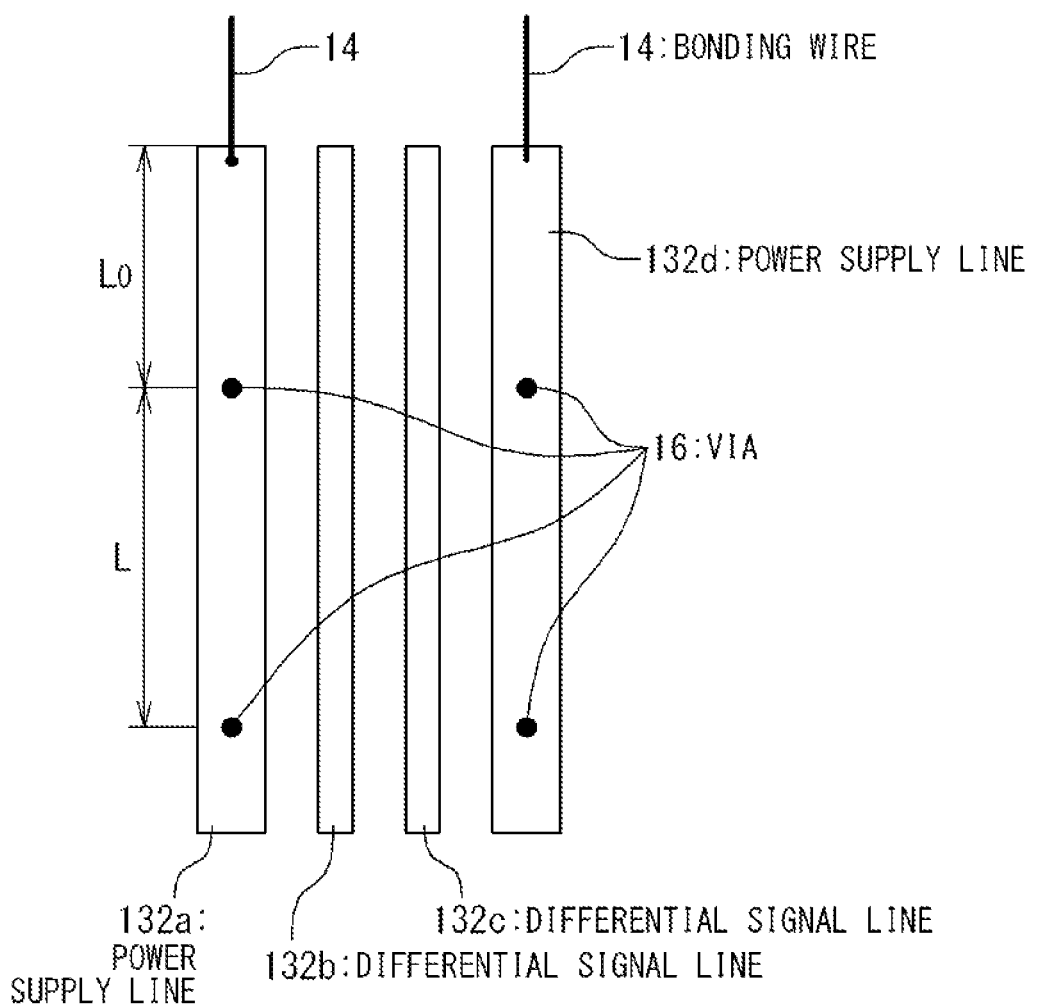
FIG. 11 is a plan view showing the interconnection structure according to a second embodiment of the present invention.

FIG. 11 is a plan view showing the interconnection structure according to a second embodiment of the present invention. The interconnection structure is provided with a first power supply line 132a, a first differential signal line 132b, a second differential signal line 132c, a second power supply line 132d and bonding wires 14. It is provided with vias 16 in the first and second power supply lines 132a and 132d. The same power supply voltages as the first and second power supply lines 132a and 132d are applied to the vias 16. It should be noted that the ground lines which are grounded may be used instead of the two power supply lines 132a and 132d such that the vias 16 are grounded, too.

In this case, it is necessary to pay attention to an interval between the vias 16 arranged in the return path interconnection. The impedance takes a minimal value at the points of the power supply lines 132a and 132d where the vias 16 are arranged. Therefore, when the distance between the two vias which are provided in the same power supply line is equal to or less than ¹⁄₁₆ of the wavelength of the differential signal, there is no impedance matching solution. Also, when the distance between the two vias exceeds ¼ wavelength, it is required to cut off any longer portion because the impedance matching has no meaning. This is because the interconnection which is provided on the printed circuit board is very long, unlike the lead frame.

Therefore, the distance between the two vias provided on the same power supply line should fall in a range of ¹⁄₁₆ of the wavelength of the operation signal to ¼ of the wavelength thereof. If this limitation is kept, the same effect is attained even if the full length of the interconnection on the printed circuit board exceeds ¼ of the wavelength of the differential signal.

It should be noted that in usual signal integrity, there is a description that ground vias must be arranged in an interval as short as possible. However, in the present invention, oppositely, the enough distance must be provided between the two vias.

Also, like the first embodiment of the present invention, a distance of a connection point with the bonding wire 14 on the power supply line 132a and 132d and the via 16 which is the nearest from the bonding wire 14 must be fall in a range of ¹⁄₁₆ of the wavelength of the differential signal to ⅛ of the wavelength.

Although the present invention has been described above in connection with several embodiments thereof, it would be apparent to those skilled in the art that those embodiments are provided solely for illustrating the present invention, and should not be relied upon to construe the appended claims in a limiting sense.

What is claimed is:

1. An interconnection structure comprising:
   first and second differential signal interconnections provided to transmit a differential signal; and
   first and second voltage interconnections applied with predetermined voltages,
   wherein said first voltage interconnection, said first differential signal interconnection, said second differential signal interconnection and said second voltage interconnection are arranged in this order,
   wherein an interval between said first and second differential signal interconnections in a first direction is longer than an interval between said first voltage interconnection and said first differential signal interconnection in the first direction and is longer than an interval between said second differential signal interconnection and said second voltage interconnection in the first direction,
   wherein when a first connection point and a second connection point nearest to said first connection point are provided on any of said first and second differential signal interconnections and said first and second voltage interconnections, a distance between said first connection point and said second connection point is in a range of $1/16$ of a wavelength of the differential signal to $1/8$ of the wavelength thereof, and
   wherein said first differential signal interconnection and said second differential signal interconnection are arranged without another interconnection between them.

2. An interconnection structure according to claim 1, wherein a ratio of the interval between said first and second differential signal interconnections and the interval between said first voltage interconnection and said first differential signal interconnection is 2:1.

3. A semiconductor device comprising an interconnection structure which comprises:
   first and second differential signal interconnections provided to transmit a differential signal; and
   first and second voltage interconnections applied with predetermined voltages,
   wherein said first voltage interconnection, said first differential signal interconnection, said second differential signal interconnection and said second voltage interconnection are lead pins and arranged in this order,
   wherein an interval between said first and second differential signal interconnections in a first direction is longer than an interval between said first voltage interconnection and said first differential signal interconnection in the first direction and is longer than an interval between said second differential signal interconnection and said second voltage interconnection in the first direction,
   wherein when a first connection point and a second connection point nearest to said first connection point are provided on any of said first and second differential signal interconnections and said first and second voltage interconnections, a distance between said first connection point and said second connection point is in a range of $1/16$ of a wavelength of the differential signal to $1/8$ of the wavelength thereof, and
   wherein said first differential signal interconnection and said second differential signal interconnection are arranged without another interconnection between them.

4. A semiconductor device comprising an interconnection structure according to claim 3, wherein a ratio of the interval between said first and second differential signal interconnections and the interval between said first voltage interconnection and said first differential signal interconnection is 2:1.

5. A semiconductor device comprising:
   a mounting plate having a principal surface and a rear surface opposite to the principal surface;
   a semiconductor chip having a first main surface and a second main surface opposite to the first main surface, the semiconductor chip mounted on the principal surface of the mounting plate such that the second main surface of the semiconductor chip being faced to the principal surface of the mounting plate, a plurality of electrodes formed on the first main surface; and
   a plurality of leads arranged along the semiconductor chip, each of the leads being electrically connected with each of the electrodes via a plurality of wires respectively, the leads including a first lead for first power supply, a second lead for first differential signal, a third lead for second differential signal and a fourth lead for second power supply,
   wherein the first lead, second lead, third lead and fourth lead are arranged in this order,
   wherein a first length between the second lead and the third lead in a first direction is greater than a second length between the first lead and the second lead in the first direction, and
   wherein the first lead and the second lead are arranged without another lead between them.

6. The semiconductor device according to claim 5, wherein the second lead and the third lead are arranged without another lead between them.

7. The semiconductor device according to claim 6, wherein the first length between the second lead and the third lead in the first direction is greater than a third length between the third and fourth leads in the first direction, and
   wherein the third lead and the fourth lead are arranged without another lead between them.

8. The semiconductor device according to claim 7, further comprising:
   the leads including a fifth lead for third differential signal, a sixth lead for fourth differential signal and seventh lead for third power supply,
   wherein the fourth lead, the fifth lead, the sixth lead and the seventh lead are arranged in this order,
   wherein a fourth length between the fifth lead and the sixth lead in the first direction is greater than a fifth length between the fourth lead and the fifth lead in the first direction, and
   wherein the fifth lead and the sixth lead are arranged without another lead between them.

9. The semiconductor device according to claim 8, wherein the fifth lead and the sixth lead are arranged without another lead between them.

10. The semiconductor device according to claim 8, wherein the fourth length between the fifth lead and the sixth lead in the first direction is greater than a sixth length between the sixth lead and the seventh lead in the first direction, and wherein the sixth lead and the seventh lead are arranged without another lead between them.

11. The semiconductor device according to claim 9, wherein a ratio meets a relation such that 0<(the second length)/(the first length)<1.

12. The semiconductor device according to claim 10, wherein a ratio of the first length between the second lead and the third lead and the second length between the first lead and the second lead is 2:1.

13. The semiconductor device according to claim 8, wherein a ratio meets a relation such that 0<(the fifth length)/(the fourth length)<1.

14. The semiconductor device according to claim 10, wherein a ratio of the fourth length between the fifth lead and the sixth lead and the fifth length between the fourth lead and the fifth lead is 2:1.

15. The semiconductor device according to claim 10, further comprising:
a mold resin covering the mounting plate, the semiconductor chip and a part of the leads and the wires.

* * * * *